US011337009B2

(12) United States Patent
Duan et al.

(10) Patent No.: US 11,337,009 B2
(45) Date of Patent: May 17, 2022

(54) PIEZOELECTRIC MEMS MICROPHONE

(71) Applicant: AAC ACOUSTIC TECHNOLOGIES (SHENZHEN) CO., LTD., Shenzhen (CN)

(72) Inventors: Lian Duan, Shenzhen (CN); Rui Zhang, Shenzhen (CN)

(73) Assignee: AAC Acoustic Technologies (Shenzhen) Co., Ltd., Shenzhen (CN)

(*) Notice: Subject to any disclaimer, the term of this patent is extended or adjusted under 35 U.S.C. 154(b) by 23 days.

(21) Appl. No.: 17/137,352

(22) Filed: Dec. 30, 2020

(65) Prior Publication Data
US 2021/0392441 A1 Dec. 16, 2021

(30) Foreign Application Priority Data
Mar. 10, 2020 (CN) .......................... 202010161564.9

(51) Int. Cl.
*H04R 17/02* (2006.01)
*B81B 3/00* (2006.01)

(52) U.S. Cl.
CPC ............ *H04R 17/02* (2013.01); *B81B 3/0021* (2013.01); *B81B 2201/0257* (2013.01); *H04R 2201/003* (2013.01); *H04R 2231/003* (2013.01)

(58) Field of Classification Search
CPC .............. B81B 3/0021; B81B 3/007; B81B 2201/0127; B81B 2203/0127; H04R 17/02; H04R 2201/003; H04R 2231/003; H04R 17/00; H04R 31/003
See application file for complete search history.

(56) References Cited

U.S. PATENT DOCUMENTS

| 9,029,963 | B2* | 5/2015 | Sparks | G01L 9/008 |
| | | | | 257/416 |
| 9,055,372 | B2* | 6/2015 | Grosh | H04R 17/02 |
| 10,710,874 | B2* | 7/2020 | Frischmuth | G01L 1/00 |

* cited by examiner

*Primary Examiner* — Brian Ensey
(74) *Attorney, Agent, or Firm* — W&G Law Group

(57) ABSTRACT

A piezoelectric MEMS microphone is disclosed. The microphone includes a base having a cavity; a piezoelectric diaphragm; a fixation beam connecting with the piezoelectric diaphragm; and a support beam connecting with the base and the fixation beam. The piezoelectric diaphragm has a number of diaphragm sheets fixed by the fixation beam, each diaphragm sheet having a fixed end and a free end. The fixed end is connected with the fixation beam, and the free end extends from the fixed end to two sides and is suspended above the cavity. Compared with the related art, mechanical strength of the diaphragm sheet is improved, and the output intensity of the signal is improved.

14 Claims, 12 Drawing Sheets

PIEZOELECTRIC MEMS MICROPHONE

FIELD OF THE PRESENT DISCLOSURE

The invention relates to the technical field of acousto-electric conversion devices, in particular to a piezoelectric MEMS microphone.

DESCRIPTION OF RELATED ART

Piezoelectric micro-electro-mechanical System (MEMS) microphones have many advantages over conventional capacitive MEMS microphones, comprising dust and water repellency, and higher maximum output sound pressure (Acoustic Overload Point, AOP). In order to reduce the deformation of diaphragm sheet surface caused by residual stress, thus reducing the noise floor and improving the sensitivity, many diaphragm sheets of piezoelectric MEMS microphone are cantilever structures with one end fixed and the other end free.

Referring to FIGS. 1 and 2, the fixed end 211 of the diaphragm sheet 21 on the piezoelectric diaphragm 20 is around the cavity 14 of the base 10, and the free end 212 is in the center. Under the action of the sound pressure, the free end 212 drives the cantilever to vibrate, and the diaphragm sheet 21 close to the fixed end 211 generates a voltage under the action of the force. When an external sound signal is transmitted from the sound hole, the sound pressure causes the cantilever to deform, and a voltage change is generated, so that an acoustic signal is sensed.

The structure is characterized in that the fixed end 211 is constrained on the base 10, the free end 212 at the other end can vibrate up and down along the arrow direction under the action of sound pressure, electric charges are generated through the piezoelectric material, and the electric charges are collected by the electrode and converted into voltage signals, thereby sensing the acoustic signal. However, the sensitivity of this design is limited, without considering other factors, the sensitivity of the diaphragm sheet of the piezoelectric MEMS microphone is generally around −44 dB, and it is difficult to be further improved.

Therefore, in order to further enhance the sensitivity of piezoelectric MEMS microphone, it is necessary to improve the structure to enhance the sensitivity.

SUMMARY OF THE PRESENT INVENTION

One of the major objects of the present invention is to provide a piezoelectric MEMS microphone with improved strength and output intensity.

Accordingly, the present invention provides a piezoelectric MEMS microphone including a base having a cavity; a piezoelectric diaphragm; a fixation beam connecting with the piezoelectric diaphragm; and a support beam connecting with the base and the fixation beam. The piezoelectric diaphragm includes a plurality of diaphragm sheets fixed by the fixation beam, each diaphragm sheet comprising a fixed end and a free end. The fixed end is connected with the fixation beam, and the free end extends from the fixed end to two sides and is suspended above the cavity.

Further, the fixation beam fixes the diaphragm sheet in a middle of the diaphragm sheet.

Further, the support beam is provided on the upper side or the lower side of the gap between the adjacent diaphragm sheets.

Further, each diaphragm sheet is formed by superposing a piezoelectric material and at least two electrodes; a outermost layer of each diaphragm sheet is provided with the electrode; adjacent electrodes are spaced from each other by the piezoelectric material.

Further, the fixation beam is positioned on the upper side of the piezoelectric diaphragm to fix the piezoelectric diaphragm.

Further, the fixation beam is positioned on the lower side of the piezoelectric diaphragm to fix the piezoelectric diaphragm.

Further, the fixation beams are positioned at the upper side and the lower side of the piezoelectric diaphragm to fix the piezoelectric diaphragm.

Further, the fixation beam is located at a symmetrical position to the diaphragm sheet.

Further, the fixation beam is located at an asymmetric position of the diaphragm sheet.

Further, a width of each diaphragm sheet gradually increases or decreases from the fixed end toward the free end.

Further, the shape of each diaphragm sheet is a polygon or a curved shape changing from the fixed end to the free end without a fixed rule.

Further, the free ends of adjacent diaphragm sheets are connected using an elastic structure.

Further, the elastic structure is provided in a gap between adjacent diaphragm sheets.

Further, the elastic structure is provided at an end of the free end of adjacent diaphragm sheets.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

Figure 1:
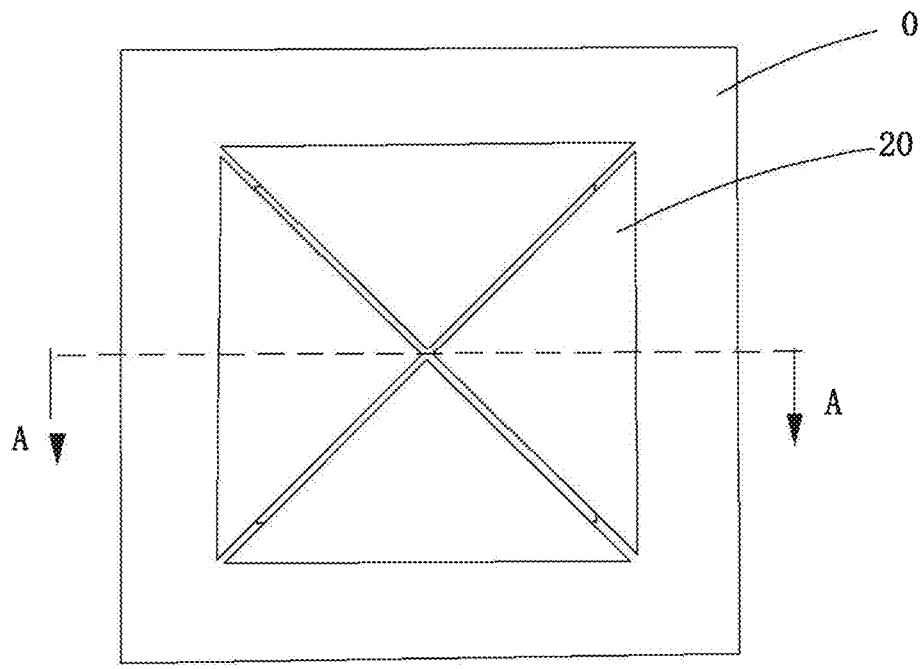
FIG. 1 is a top view of a related piezoelectric MEMS microphone.
Figure 2:
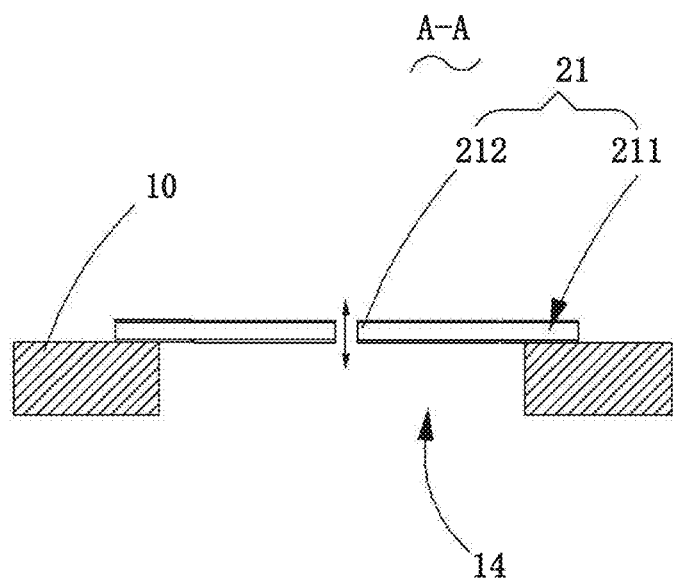
FIG. 2 is a cross-sectional view of the microphone in FIG. 1, taken along line A-A.
Figure 3:
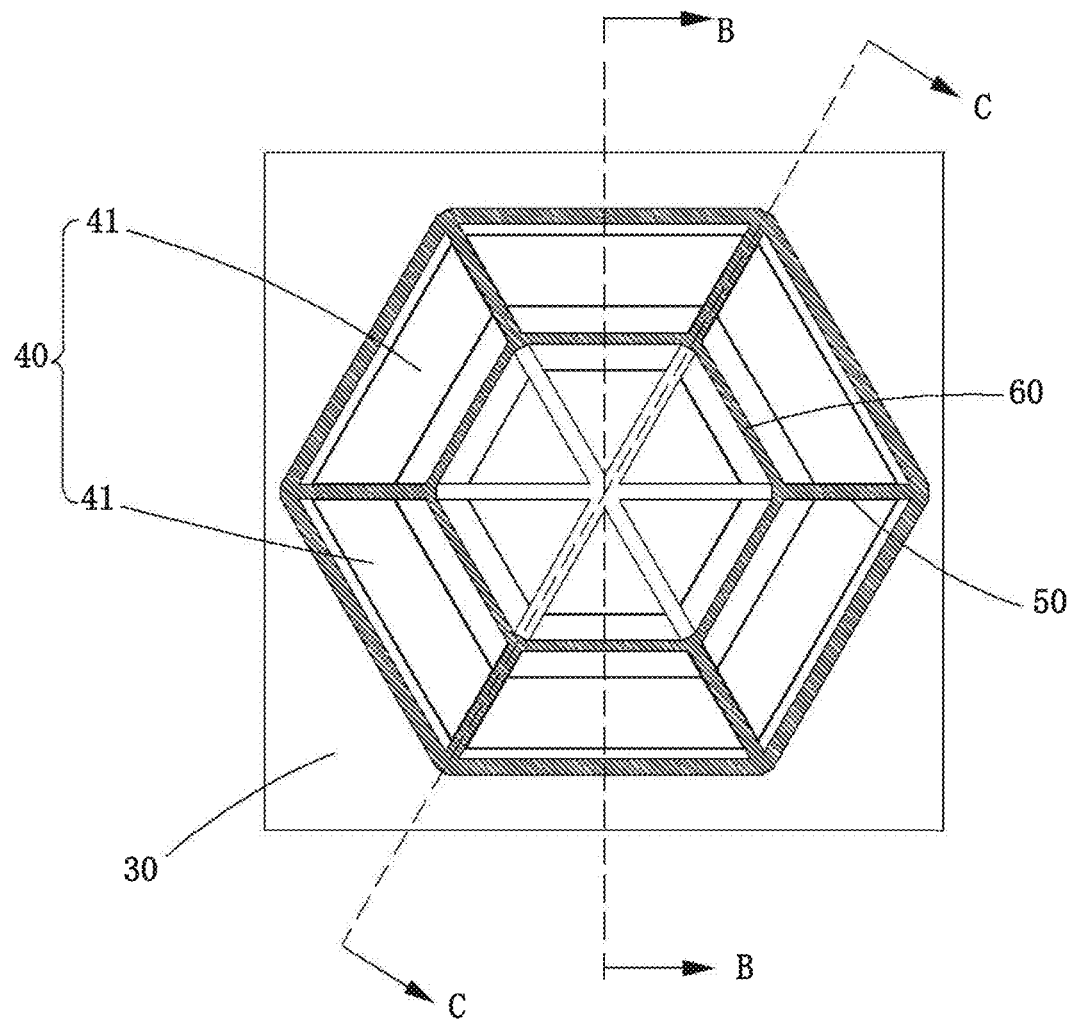
FIG. 3 is a top plan view of a piezoelectric MEMS microphone according to a first embodiment of the present invention.
Figure 4:
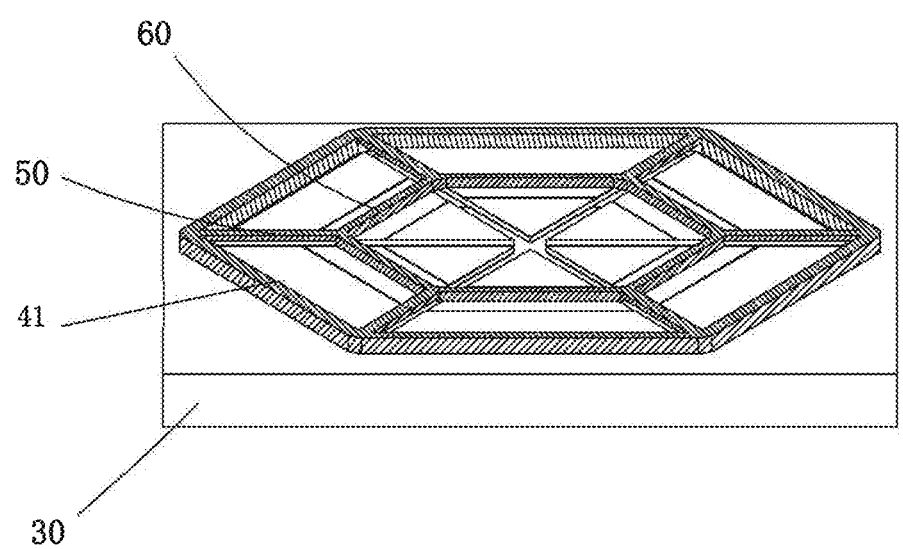
FIG. 4 is a schematic diagram of an isometric structure according to the first embodiment of the present invention.
Figure 5:
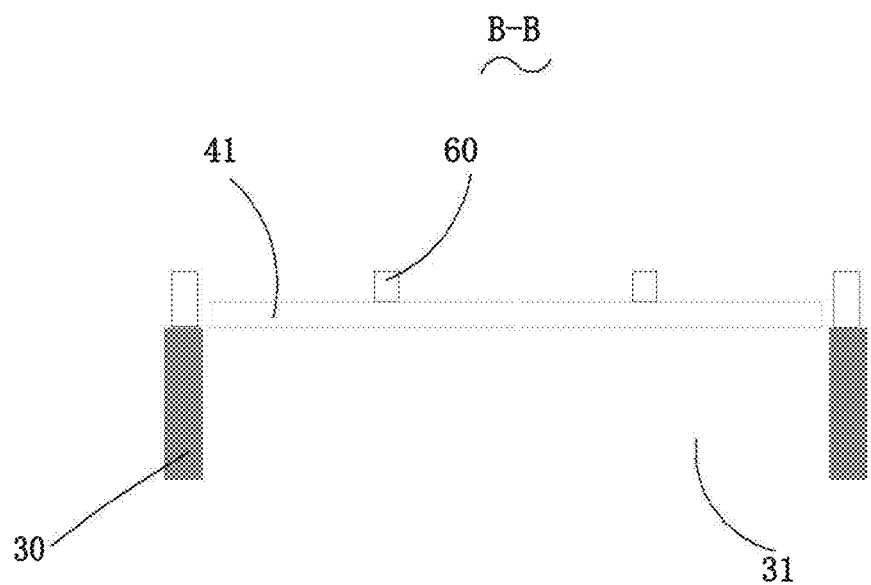
FIG. 5 is a sectional view at B-B in FIG. 3.
Figure 6:
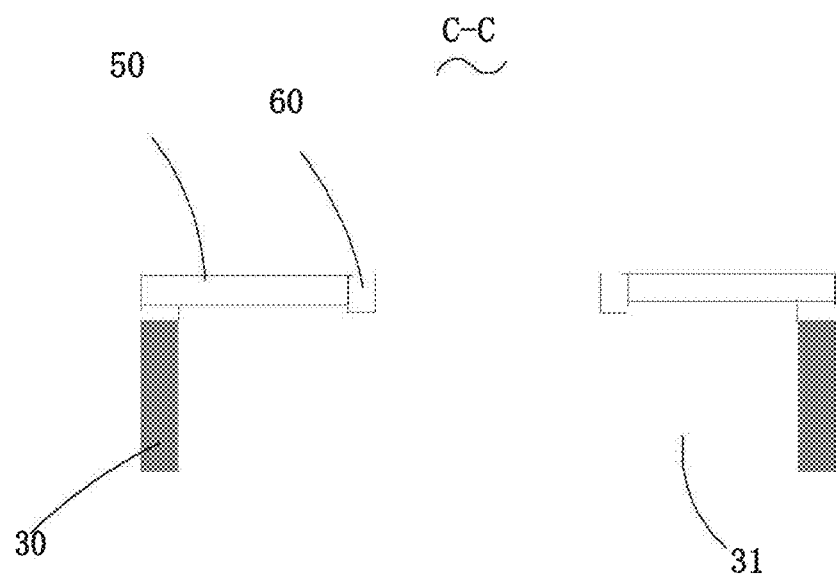
FIG. 6 is a sectional view at C-C in FIG. 3.
Figure 7:
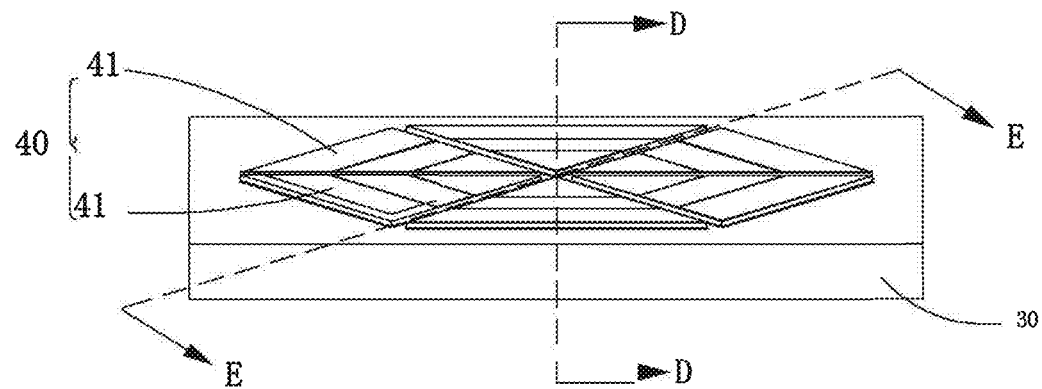
FIG. 7 is a plan view of a top plan view of a piezoelectric MEMS microphone according to a second embodiment of the present invention.
Figure 8:
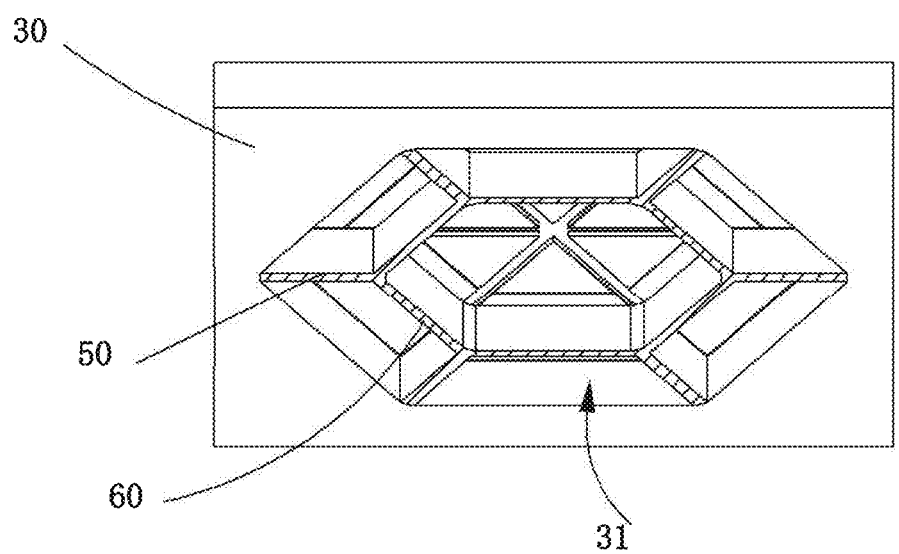
FIG. 8 is a bottom plan view of the piezoelectric MEMS microphone provided by the second embodiment of the present invention.
Figure 9:
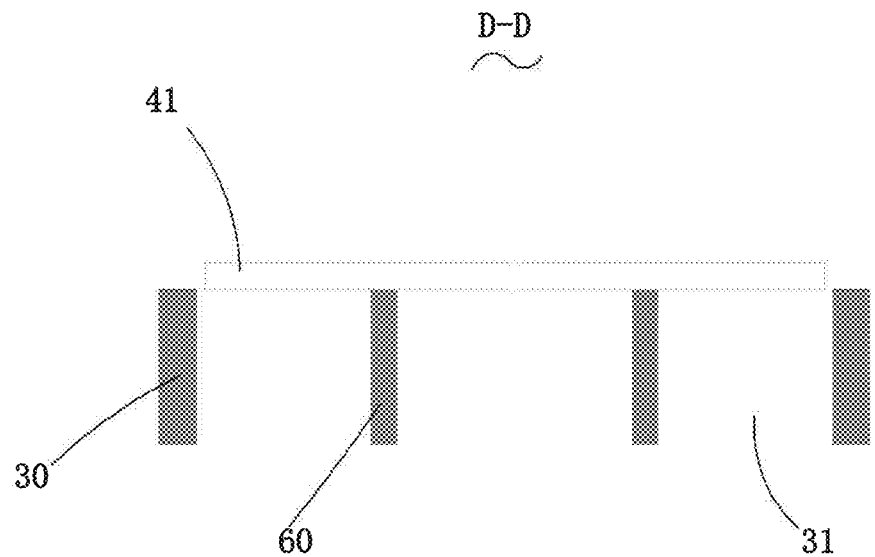
FIG. 9 is a sectional view at D-D in FIG. 7.
Figure 10:
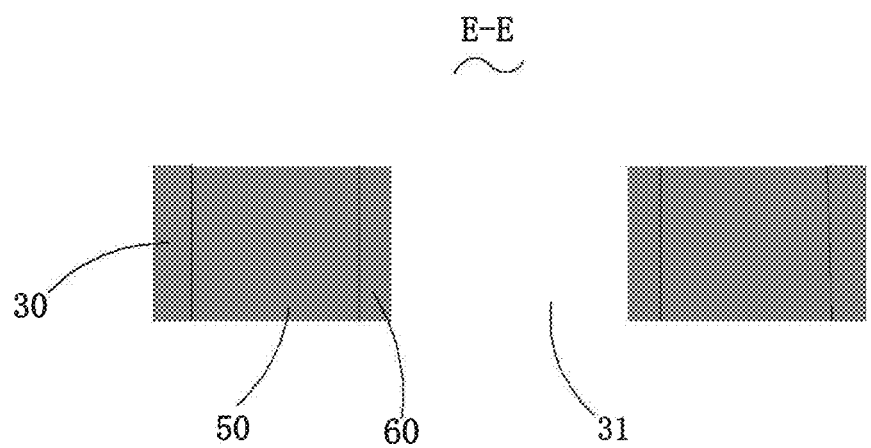
FIG. 10 is a sectional view at E-E in FIG. 7.
Figure 11:
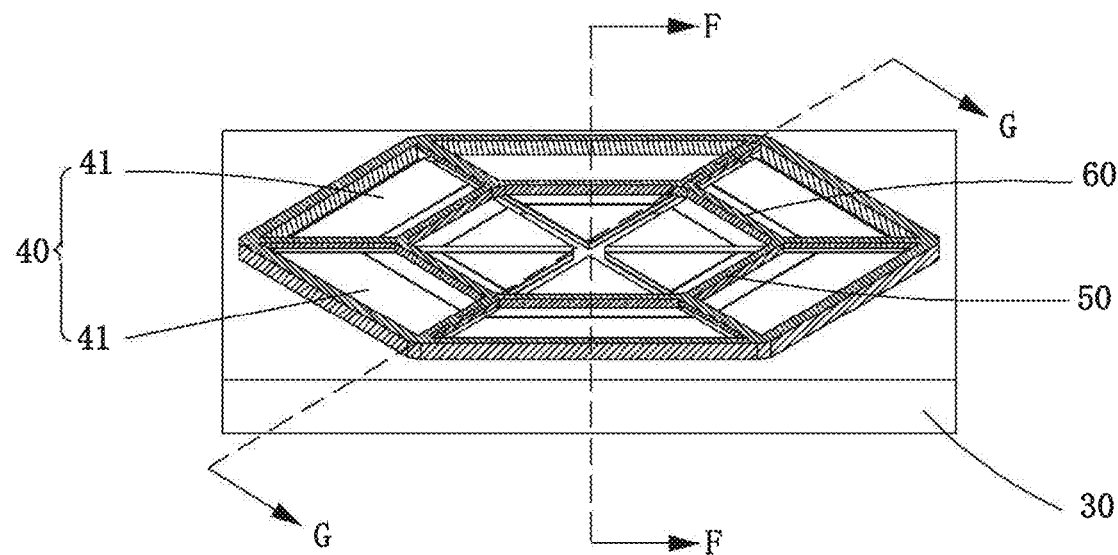
FIG. 11 is a top plan view of a piezoelectric MEMS microphone according to a third embodiment of the present invention.
Figure 12:
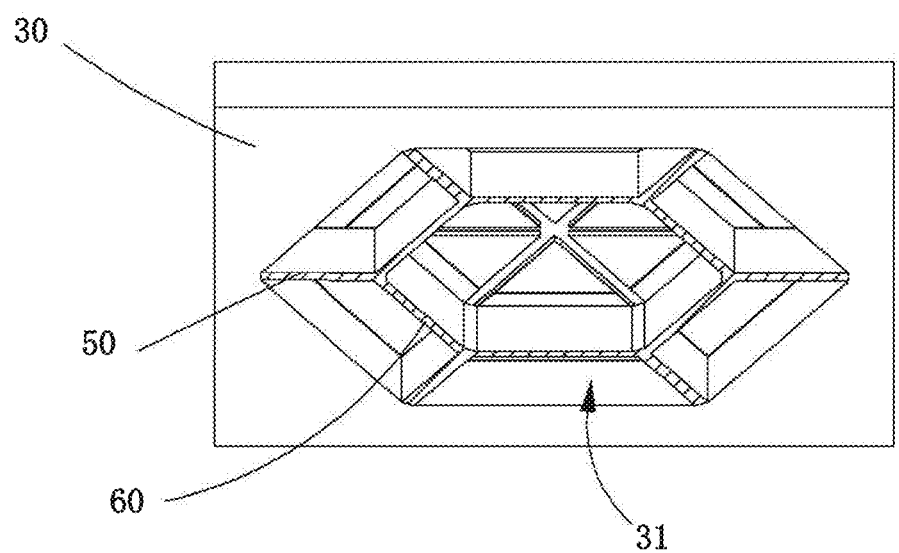
FIG. 12 is a bottom view of the piezoelectric MEMS microphone according to the third embodiment of the present invention.
Figure 13:
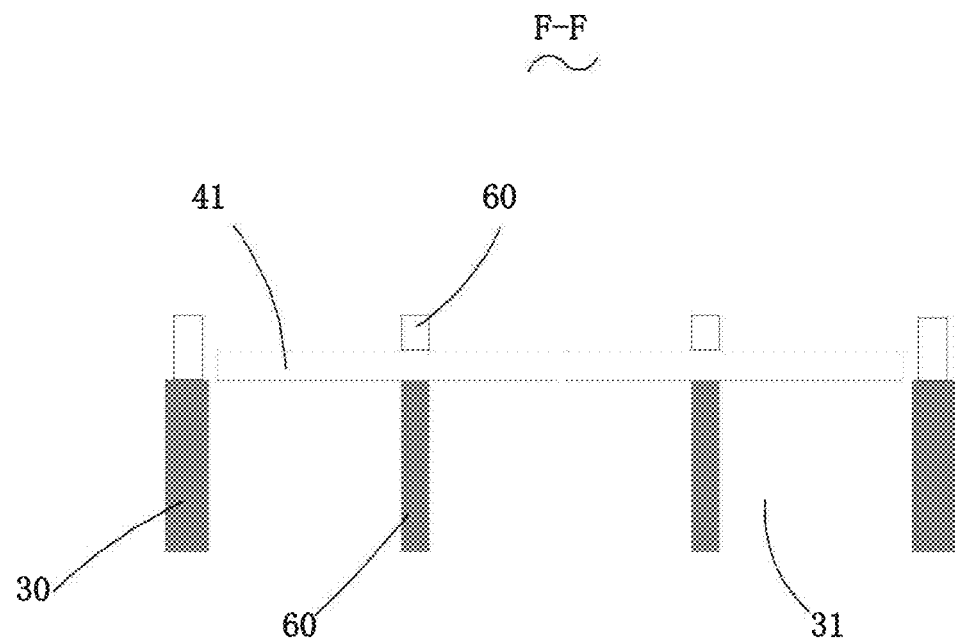
FIG. 13 is a sectional view at F-F in FIG. 11.
Figure 14:
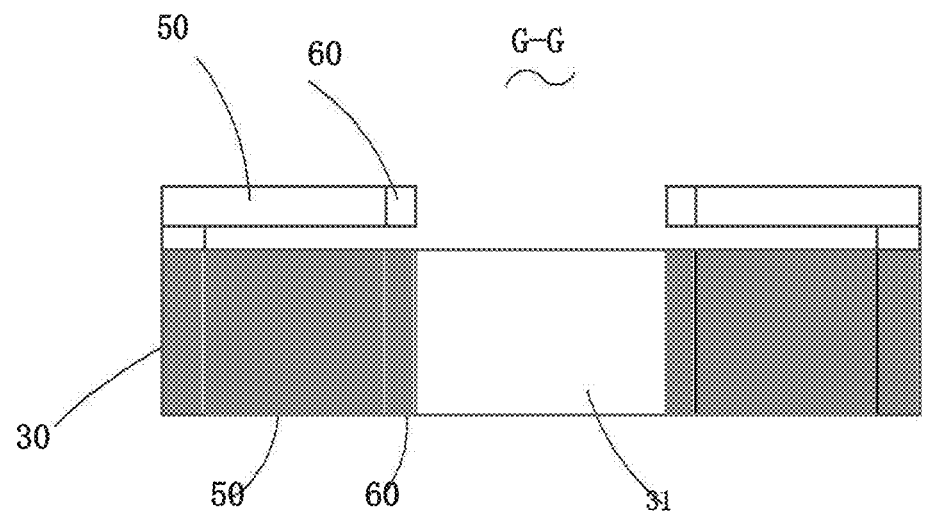
FIG. 14 is a sectional view at G-G in FIG. 11.

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

It should be noted that all directional indications (such as up, down, inside, outside, top, bottom.) in the embodiments of the present invention are only used to explain the relative positional relationship between the components in a certain posture (as shown in the drawings), and if the specific posture is changed, the directional indication is changed accordingly.

Referring to FIG. 3, FIG. 4, FIG. 5 and FIG. 6, the first embodiment of the present invention provides a piezoelectric MEMS microphone. The piezoelectric MEMS microphone comprises a base 30, a piezoelectric diaphragm 40, a support beam 50 and a fixation beam 60, wherein the base 30 is provided with a cavity 31, the support beam 50 connects the base 30 and the fixation beam 60, the fixation beam 60 connects the piezoelectric diaphragm 40. The piezoelectric diaphragm 40 comprises a plurality of diaphragm sheets 41, each diaphragm sheet 41 is fixed by the fixation beam 60 in the middle of the upper side of the diaphragm sheet 41. The support beam 50 is provided on the upper side of the gap between the adjacent diaphragm sheets. An external sound signal is transmitted from the sound hole, and the sound pressure generated by the sound causes the piezoelectric diaphragm 40 to be deformed to generate a voltage change, so that the acoustic signal is perceived.

Referring to FIG. 7, FIG. 8, FIG. 9 and FIG. 10 in combination, the difference from the first embodiment is that, in the second embodiment, the fixation beam 60 is arranged at the lower side of the diaphragm sheet 41, and the diaphragm sheet 41 is fixed in the middle of the lower side of it by the fixation beam 60. The support beam 50 connects the base 30 and the fixation beam 60; the support beam 50 is provided at the lower side of the gap between the adjacent diaphragm sheets.

Referring to FIG. 11, FIG. 12, FIG. 13 and FIG. 14 in combination, the difference from the first embodiment is that, in the third embodiment, the fixation beam 60 is provided on the upper side and the lower side of the diaphragm sheet 41. The upper side of the diaphragm sheet 41 is fixed by the fixation beam 60 in the middle of the upper side of the diaphragm sheet 41, the lower side of the diaphragm sheet 41 is fixed by the fixation beam 60 in the middle of the lower side of the diaphragm sheet 41. The fixation beam 60 is connected to the support beam 50, the support beam 50 is connected to the base 30, and the support beam 50 is provided on the upper side and the lower side of the gap between the adjacent diaphragm sheets.

Figure 15:
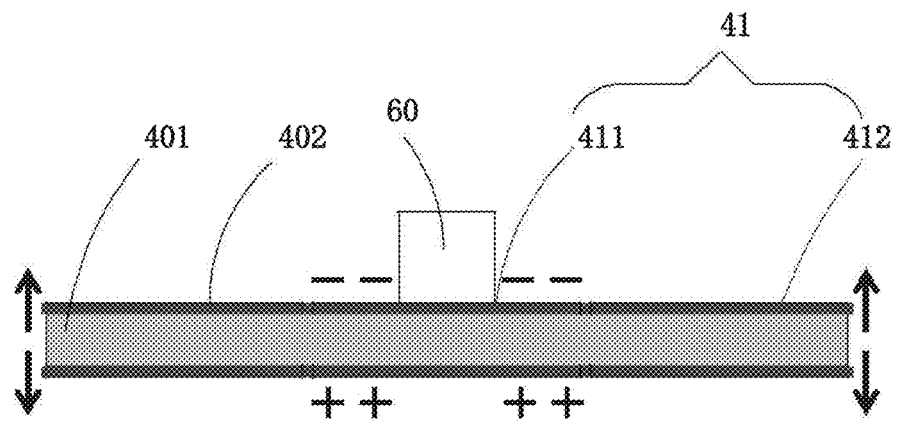
FIG. 15 is a schematic cross-sectional view of a fixation beam above the piezoelectric diaphragm according to the first embodiment of the present invention.
Figure 16:
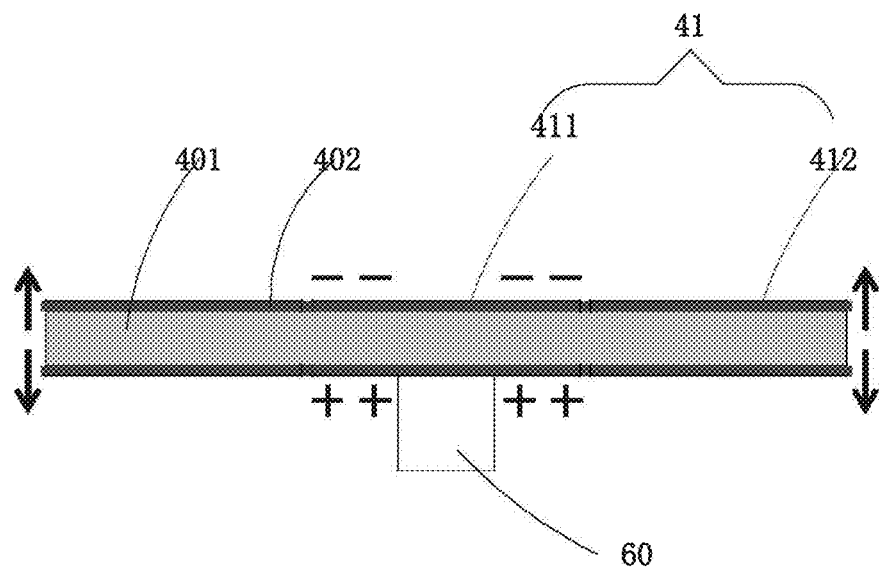
FIG. 16 is a schematic cross-sectional view of a fixation beam below the piezoelectric diaphragm according to the second embodiment of the present invention.
Figure 17:
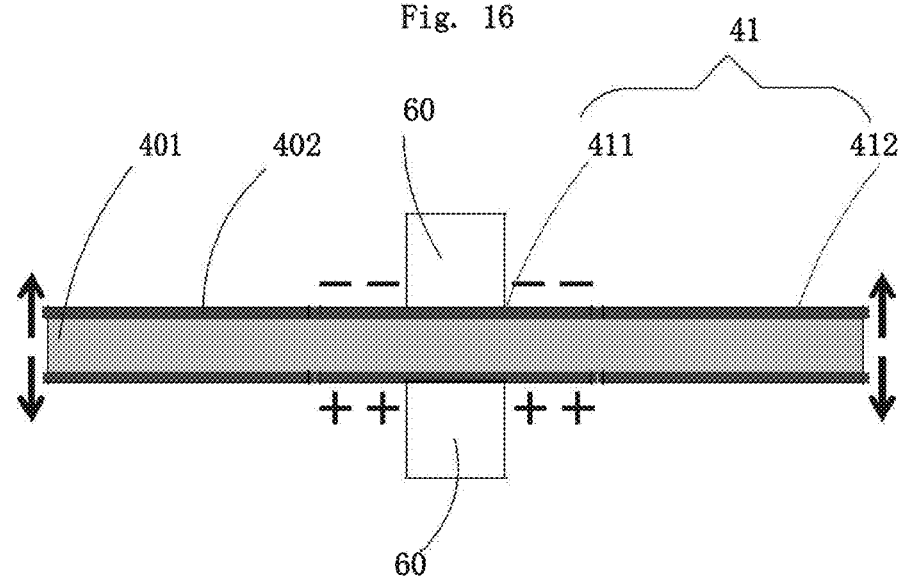
FIG. 17 is a schematic cross-sectional view of a fixation beam above and below the piezoelectric diaphragm according to the third embodiment of the present invention.

Referring to FIG. 15, FIG. 16 and FIG. 17, the diaphragm sheet 41 is formed by superposing a piezoelectric material 401 and an electrode 402, and the electrode 402 comprises at least two electrodes. In the embodiments of the invention, the electrodes 402 are provided on both the upper and lower sides of the piezoelectric material 401 to form a three-layer structure of the diaphragm sheet. In the five-layer structure of the diaphragm sheet of other embodiments, the electrodes are superposed at intervals by the piezoelectric material, a first electrode, a first piezoelectric material, a second electrode, a second piezoelectric material and a third electrode are sequentially superposed from bottom to top, or any other piezoelectric diaphragm formed by superposing an electrode and a piezoelectric material, is also applicable to the present invention.

Referring to FIG. 15 again, in the first embodiment, each diaphragm sheet 41 comprises a fixed end 411 and a free end 412 extending from the fixed end 411 to both ends, and the fixed end 411 is connected to the fixation beam 60. The fixed end 411 is formed at the middle position of the diaphragm sheet 41, but is not necessarily limited to the middle position of the diaphragm sheet 41. In other embodiments, the fixed end 411 may be at any position of a diaphragm sheet 41, as long as both sides extend to form the free end 412. The free end 412 extends from the fixed end 411 to both ends and is suspended above the cavity; the fixation beam 60 is connected to the fixed end 411 on the upper side of the diaphragm sheet 41, the vertical projection profile of the free end 412 at the bottom of the base is projected within the cavity of the base. The middle part of the diaphragm sheet 41 is fixed by the fixation beam 60 to form a diaphragm structure with a fixed end 411 at the middle part and free ends 412 at the two sides, and the free ends 412 at the two sides vibrate up and down along the arrow direction under the action of sound pressure, charges are generated on both sides of the diaphragm sheet 41 near the fixed end 411 and are further collected by the electrode 402 to form an output voltage signal.

Referring to FIG. 16 again, the difference from the first embodiment is that in the second embodiment, the fixation beam 60 is located at the lower side of the diaphragm sheet 41.

Referring to FIG. 17 again, the difference from the first embodiment is that in the third embodiment, the fixation beam 60 is located on the upper side and the lower side of the diaphragm sheet 41.

Figure 18:
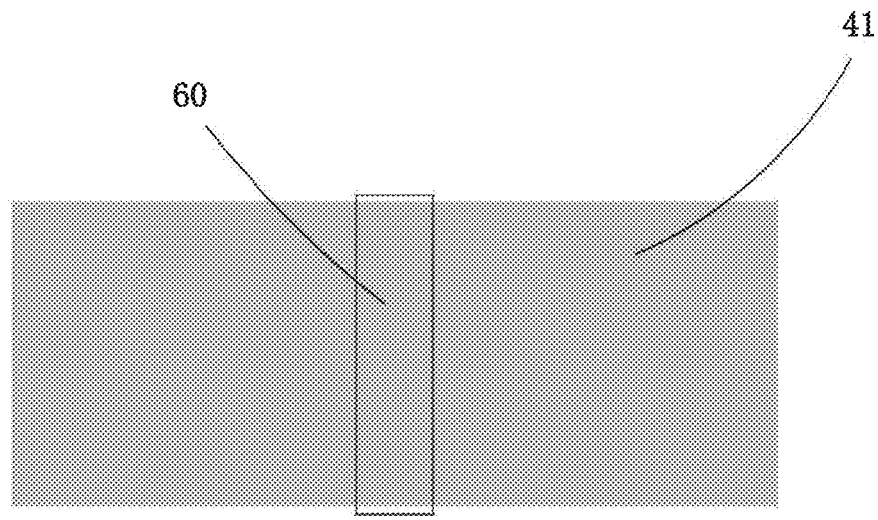
FIG. 18 is a schematic diagram of the fixation beam position of a symmetric die provided in a fourth embodiment of the present invention.
Figure 19:
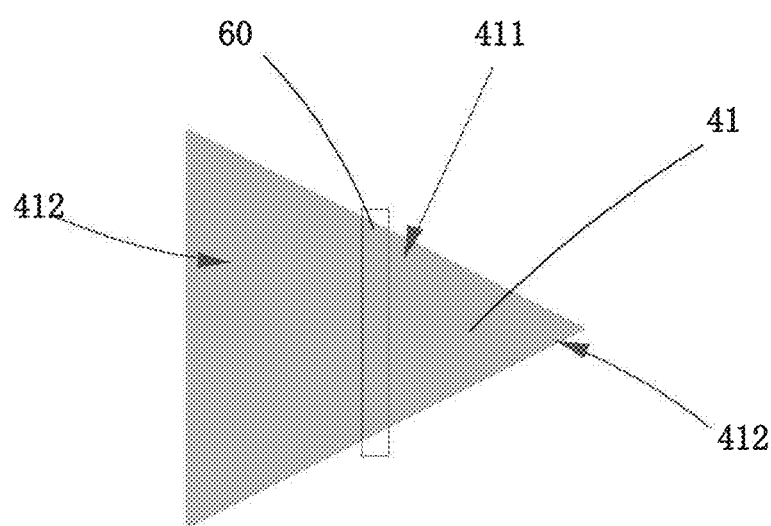
FIG. 19 is a schematic diagram of the fixation beam position of an asymmetric die provided in a fifth embodiment of the present invention.

Please refer to FIG. 18 and FIG. 19 in combination, in the fourth embodiment shown in FIG. 18, the fixation beam 60 is located at a symmetrical position of the diaphragm sheet 41, so that both sides of the diaphragm sheet 41 are symmetrical; in the fifth embodiment shown in FIG. 19, the fixation beam 60 is located at an asymmetric position of the diaphragm sheet 41, so that both sides of the diaphragm sheet 41 are in an asymmetric shape; the width of the diaphragm sheet 41 on one side gradually increases from the fixed end 411 toward the free end 412, on the other side, the diaphragm sheet 41 gradually narrows in width from the fixed end 411 toward the free end 412.

Figure 20:
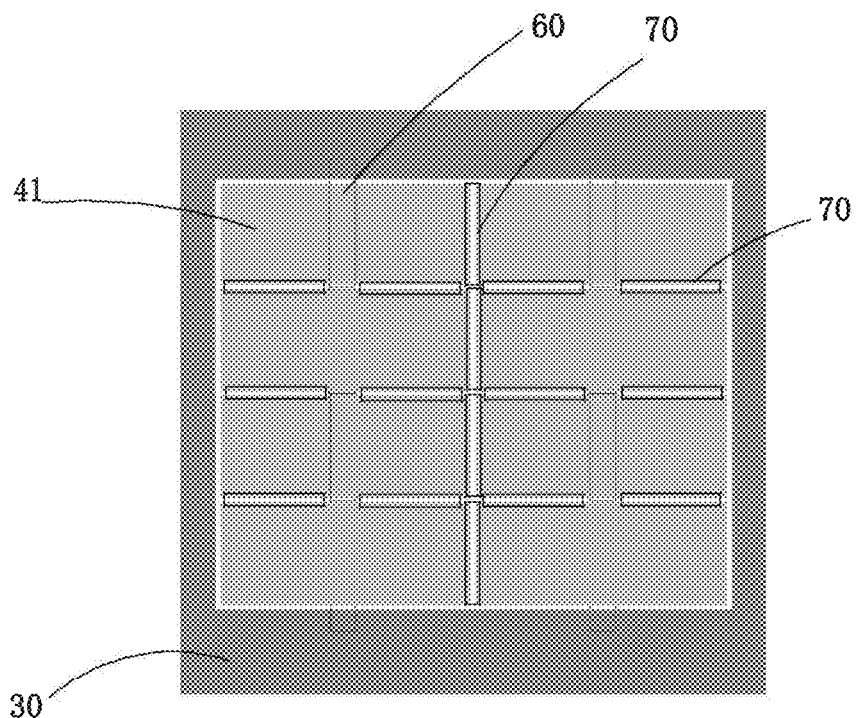
FIG. 20 is a top plan view of the piezoelectric MEMS microphone of the symmetric die according to a sixth embodiment of the present invention.
Figure 21:
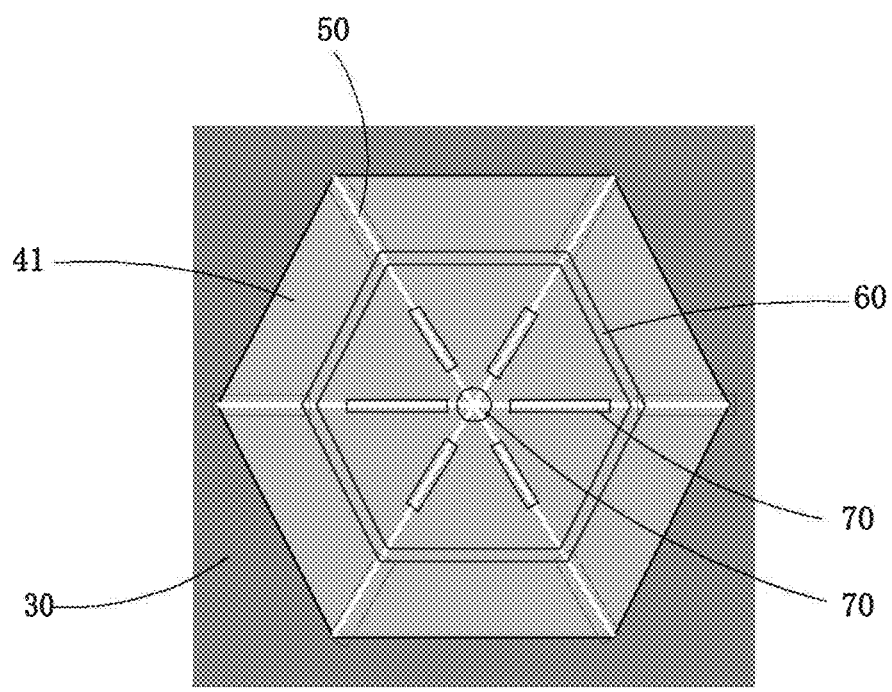
FIG. 21 is a top plan view of the piezoelectric MEMS microphone of the asymmetric die according to a seventh embodiment of the present invention.
Figure 22A:
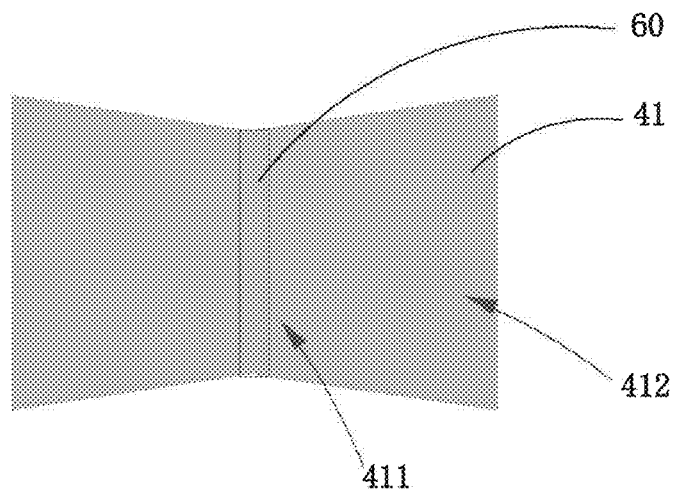
FIG. 22A is a schematic diagram of the position of the fixation beam of the first of three typical symmetric dies according to an eighth embodiment of the present invention.
Figure 22B:
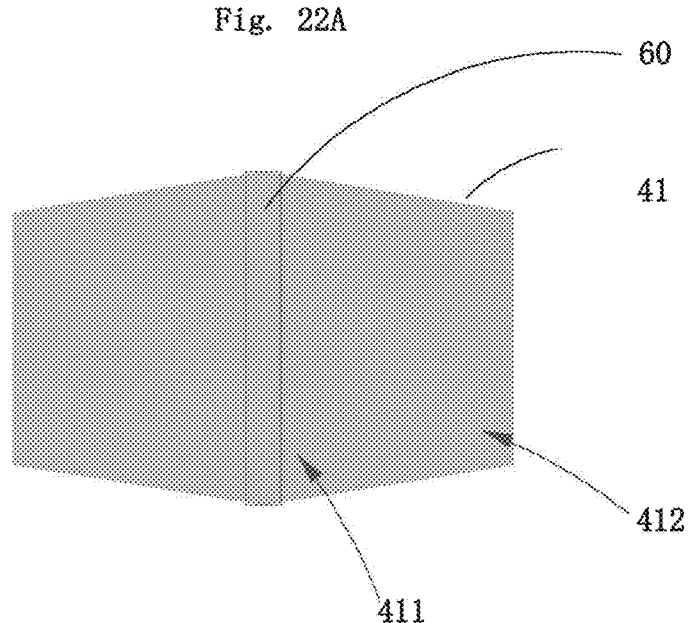
FIG. 22B is a schematic diagram of the position of the fixation beam of the second of three typical symmetric dies according to the eighth embodiment of the present invention.
Figure 22C:
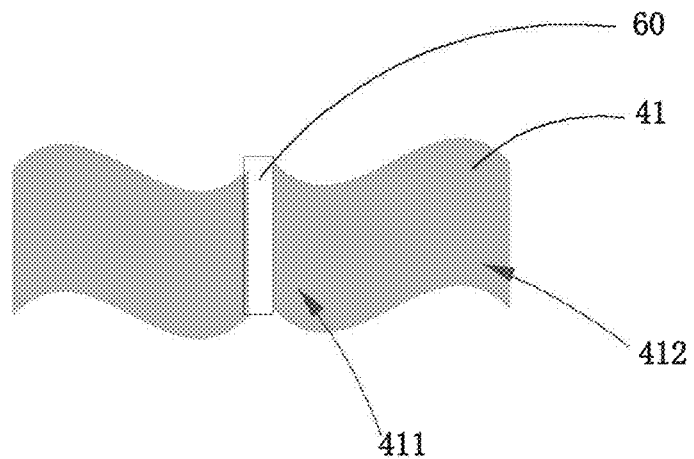
FIG. 22C is a schematic diagram of the position of the fixation beam of the third of three typical symmetric dies according to the eighth embodiment of the present invention.

Referring to FIG. 20, FIG. 21 and FIG. 22 together, in the sixth embodiment shown in FIG. 20, the diaphragm sheets 41 on the two sides of the fixation beam 60 are piezoelectric MEMS microphone with symmetrical shapes. In the seventh embodiment shown in FIG. 21, the diaphragm sheet 41 on both sides of the fixation beam 60 is a piezoelectric MEMS microphone having an asymmetric shape. The eighth embodiment shown in FIG. 22 provides three typical symmetrical diaphragm sheets 41, and the symmetrical diaphragm sheets 41 shown in FIG. 22A gradually widen from the fixed end 412 to the free end 411, respectively. The symmetric diaphragm sheets 41 shown in FIG. 22B gradually narrow from the fixed end 412 to the free end 411. The symmetric diaphragm sheets 41 shown in FIG. 22C have a polygon or curve shape with a atypical changing rule from the fixed end 412 to the free end 411. The specific design can be determined by the size, signal-to-noise ratio, resonant frequency, reliability and other performance requirements of the required piezoelectric MEMS microphone.

Referring to FIG. 20 and FIG. 21 again, in particular, for that between the free ends of adjacent diaphragm sheets 41, the elastic structure 70 can be selectively designed to connect the adjacent diaphragm sheets 41. The elastic structure 70 may be provided in the gap between adjacent diaphragm sheets 41 or at the free end of adjacent diaphragm sheets 41. The elastic structure enables adjacent diaphragm sheets to vibrate synchronously, reducing the difference of diaphragm sheet gaps and improving the frequency characteristic of the piezoelectric MEMS microphone in a low frequency range.

The free end of the piezoelectric MEMS microphone of the invention vibrates under the action of sound pressure, and the piezoelectric diaphragm close to the fixed end generates a voltage signal. Compared with the prior art, the fixed end of the diaphragm sheet of the piezoelectric diaphragm with any given shape is fixed, a free end is formed from the fixed end to two sides, and the fixed end is fixed by a fixation beam, the length of the free end becomes relatively short, thereby improving the mechanical strength of the diaphragm sheet and increasing the resonance frequency of the diaphragm sheet; at the same time, both free ends can vibrate, so two places near the fixed end can generate charges, which can superimpose the output intensity of the signal and improve the sensitivity.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A piezoelectric MEMS microphone, comprising:
a base having a cavity;
a piezoelectric diaphragm;
a fixation beam connecting with the piezoelectric diaphragm;
a support beam connecting with the base and the fixation beam; wherein
the piezoelectric diaphragm comprises a plurality of diaphragm sheets fixed by the fixation beam, each diaphragm sheet comprising a fixed end and a free end;
the fixed end is connected with the fixation beam, and the free end extends from the fixed end to two sides and is suspended above the cavity.

2. The piezoelectric MEMS microphone as described in claim 1, wherein the fixation beam fixes the diaphragm sheet in a middle of the diaphragm sheet.

3. The piezoelectric MEMS microphone as described in claim 1, wherein the support beam is provided on the upper side or the lower side of the gap between the adjacent diaphragm sheets.

4. The piezoelectric MEMS microphone as described in claim 1, wherein each diaphragm sheet is formed by superposing a piezoelectric material and at least two electrodes; a outermost layer of each diaphragm sheet is provided with the electrode; adjacent electrodes are spaced from each other by the piezoelectric material.

5. The piezoelectric MEMS microphone as described in claim 1, wherein the fixation beam is positioned on the upper side of the piezoelectric diaphragm to fix the piezoelectric diaphragm.

6. The piezoelectric MEMS microphone as described in claim 1, wherein the fixation beam is positioned on the lower side of the piezoelectric diaphragm to fix the piezoelectric diaphragm.

7. The piezoelectric MEMS microphone as described in claim 1, wherein the fixation beams are positioned at the upper side and the lower side of the piezoelectric diaphragm to fix the piezoelectric diaphragm.

8. The piezoelectric MEMS microphone as described in claim 1, wherein the fixation beam is located at a symmetrical position to the diaphragm sheet.

9. The piezoelectric MEMS microphone as described in claim 1, wherein the fixation beam is located at an asymmetric position of the diaphragm sheet.

10. The piezoelectric MEMS microphone as described in claim 1, wherein a width of each diaphragm sheet gradually increases or decreases from the fixed end toward the free end.

11. The piezoelectric MEMS microphone as described in claim 1, wherein the shape of each diaphragm sheet is a polygon or a curved shape changing from the fixed end to the free end without a fixed rule.

12. The piezoelectric MEMS microphone as described in claim 1, wherein the free ends of adjacent diaphragm sheets are connected using an elastic structure.

13. The piezoelectric MEMS microphone as described in claim 12, wherein the elastic structure is provided in a gap between adjacent diaphragm sheets.

14. The piezoelectric MEMS microphone as described in claim 12, wherein the elastic structure is provided at an end of the free end of adjacent diaphragm sheets.

* * * * *